United States Patent [19]

Lohwasser

[11] Patent Number: 5,580,386
[45] Date of Patent: Dec. 3, 1996

[54] COATING A SUBSTRATE SURFACE WITH A PERMEATION BARRIER

[75] Inventor: Wolfgang Lohwasser, Schaffhausen, Switzerland

[73] Assignee: Alusuisse-Lonza Services Ltd., Zurich, Switzerland

[21] Appl. No.: 382,524

[22] Filed: Feb. 2, 1995

Related U.S. Application Data

[62] Division of Ser. No. 982,787, Nov. 30, 1992, Pat. No. 5,436,035.

[30] Foreign Application Priority Data

Dec. 5, 1991 [CH] Switzerland ............... 03574/91

[51] Int. Cl.$^6$ .................................................. C23C 16/00
[52] U.S. Cl. .................. 118/723 MP; 118/723 HC; 118/723 DC; 118/726
[58] Field of Search .................. 427/535, 569, 427/570; 118/723 MP, 723 DC, 723 HC, 726

[56] References Cited

U.S. PATENT DOCUMENTS

| | | | |
|---|---|---|---|
| 4,448,802 | 5/1984 | Buhl | 427/42 |
| 4,524,717 | 6/1985 | Neumann | 118/718 |
| 4,917,786 | 4/1990 | Ehrich | 204/192.38 |
| 4,951,604 | 8/1990 | Temple | 118/723 |
| 5,031,408 | 7/1991 | Horn | 62/48.1 |
| 5,346,554 | 9/1994 | Suzuki | 118/723 EB |

Primary Examiner—R. Bruce Breneman
Assistant Examiner—Joni Y. Chang
Attorney, Agent, or Firm—Bachman & LaPointe, P.C.

[57] ABSTRACT

A substrate surface is coated with a permeation barrier of inorganic material, which is vaporised from a crucible in a vacuum chamber evacuated to at least $10^{-3}$ mbar and precipitated on the substrate surface. An ionizing electron beam of low energy is thus passed through the gas phase of inorganic material with formation of a plasma, preferably in the direction running approximately parallel to the substrate surface. At least one low voltage electron beam gun with assigned electrode is incorporated in the vacuum chamber between the crucible and the substrate support. The main application is for coating plastic films for the packaging industry.

3 Claims, 3 Drawing Sheets

COATING A SUBSTRATE SURFACE WITH A PERMEATION BARRIER

This is a Division of application Ser. No. 07/982,787, filed Nov. 30, 1992, now U.S. Pat. No. 5,436,035, issued Jul. 25, 1995.

BACKGROUND OF THE INVENTION

The invention relates to a process for coating a substrate surface with a permeation barrier of inorganic material, which is vaporized from a crucible in a vacuum chamber evacuated to at least $10^{-3}$ mbar and precipitated on the substrate surface. The invention also relates to a coating implement for carrying out and applying the process.

Thermal vapor deposition is the process used most often for producing optical coatings. It is because of these layers that it has been recognized that essential mechanical properties of layers are inferior to those of corresponding solids. It has also been acknowledged that deposition processes using particles of higher kinetic energy than for a standard thermal deposition lead to improved mechanical properties. Ion-assisted deposition (IAD=Ion Assisted Deposition) is one of these deposition processes.

German Patentschrift 3 543 316 describes a process for reactive vapor deposition of electrically insulating layers on substrates with simultaneous partial ionization of the vapor by means of a low voltage arc discharge and acceleration of the ions produced onto the surface to be coated. A electric field is maintained between a vapor source as the anode and the substrate surfaces at negative potential compared to the anode. An electric plasma is produced by means of electric gas discharge in front of the surface to be coated during coating. The electric gas discharge is adjusted so that the substrate surfaces are charged to a potential of −5 to −60 volts compared to the plasma potential. The ion incidence density is 0.5–3 mA/cm$^2$. The gases required for reactive vapor deposition to be reacted with the vaporized substance are supplied to the position of highest vapor density in front of the anode.

A transparent packaging film with low permeability to gases and liquids is known from U.S. Pat. No. 3,442,686. The 0.02 to 2 μm thick gas and liquid barrier consists of an inorganic material of glass-like nature vapor deposited onto a plastic film. A further plastic film is applied to this barrier layer. The mechanical protection of the contents, protection against contamination and moisture, prevention of losses of package contents and the advantageous appearance are mentioned as main functions of the packaging film.

Several conveyer coating plants for plastic films using an electron beam vaporizer are known, for example from Messrs. Leibold, BVT or Galileo. The layers produced by known vapor deposition processes are not sufficiently compact, the density of the material is, for example for silicon dioxide, only 80% of the density of a solid from the same material.

A non-compact layer has a low stability and insufficient adhesion to the substrate. In order to retain stoichiometric layers with a reactive vapor blast process, the process must be carried out using high reactive gas partial pressure, as a result of which even less dense layers are produced.

Furthermore, hitherto known processes of reionization can be used only for small vaporizer sources and low coating rates, since they either cannot be scaled or have ionization rates which are too low.

SUMMARY OF THE INVENTION

The inventors have set themselves the object of providing a process of the type discussed above and a coating implement for carrying out the process, which permit a considerably greater useable substrate surface compared to known IAD processes, and also permit compact layers with improved barrier effect (permeation barrier) at high relative rates to the vaporizer source.

The object is achieved according to the invention in a process for coating a substrate surface with a permeation barrier of inorganic material, which is vaporized form a crucible in a vacuum chamber evacuated to at least $10^{-3}$ mbar and precipitated on the substrate surface, characterized in that an ionizing electron beam of low energy is passed through the gas phase of inorganic material with formation of a plasma.

BRIEF DESCRIPTION OF THE DRAWINGS

The invention is illustrated in more detail using exemplary embodiments shown in the drawing and which are also the object of dependent claims.

DETAILED DESCRIPTION

Figure 1:
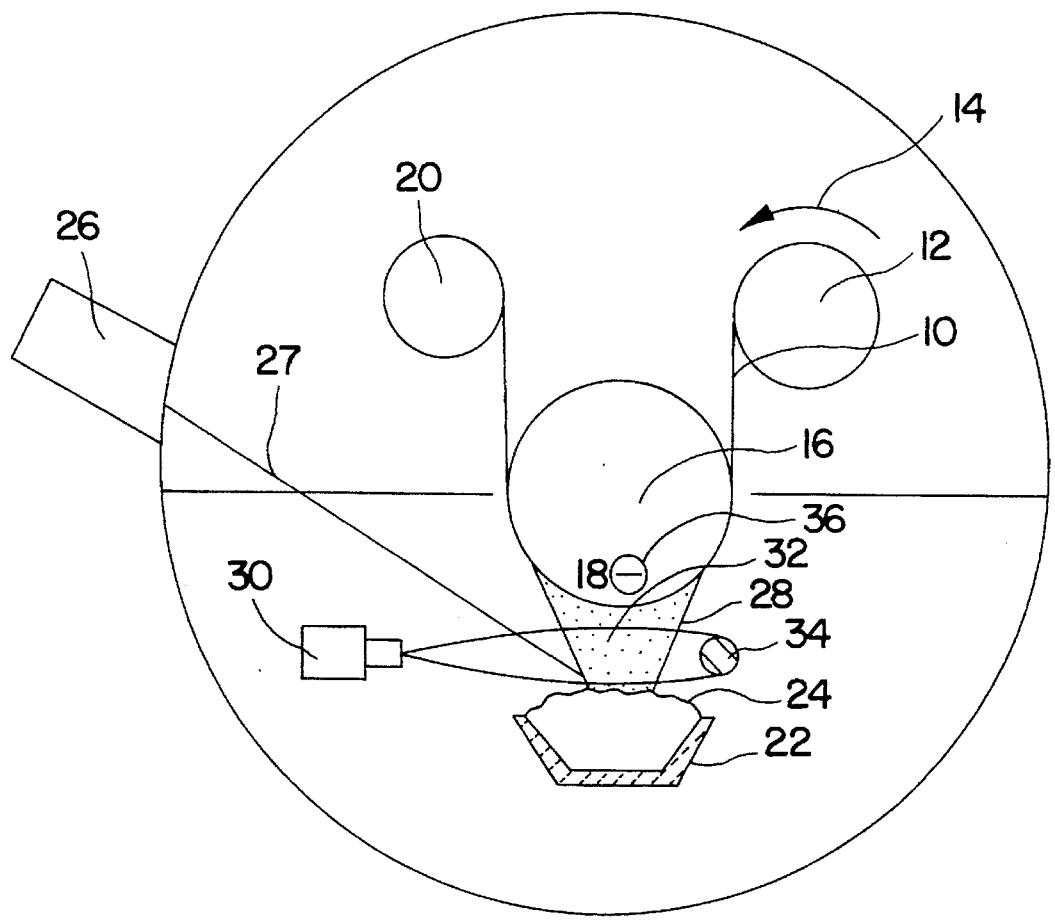
FIG. 1 shows a schematic diagram of a coating implement.

The inorganic material for forming the barrier which is effective against gases and liquids, absorbed aromatic materials, may be vaporized in any manner. The essential feature is intermixing of the material vapor with an ionizing electron beam of low energy to produce a plasma. Although this electron beam expands conically from its source, according to a first variant for the sake of simplicity it is said to run approximately parallel to the substrate surface. This statement is in principle only correct for the axial ray of the cone, because only this one actually runs parallel to the substrate surface or to its tangential surface facing the crucible. However, the essential aspect of the simplified statement consists in that according to this first variant, the ionizing electron beam does not run from the crucible to the substrate or vice versa.

According to a second variant, the ionizing electron beam of low energy is passed through the gas phase of inorganic material onto the crucible material.

The ionizing electron beam is preferably produced and maintained at a voltage of 10 to 100 volts and a current strength of 0 to 300 A, a low voltage electron beam gun known per se, for example a hollow cathode electron source (HCE), advantageously being used. A noble gas, in particular argon, and/or nitrogen is advantageously metered in in a manner known per se. The ionizing electron beam is preferably passed through the gas phase of inorganic material in the central third between the crucible and the substrate surface, in particular approximately in the center.

All materials known per se, which form a layer forming a gas and moisture barrier after deposition from the gas phase with or without a chemical reaction, are suitable as vaporizable inorganic materials. Examples which may be mentioned are silicon monoxide, silicon dioxide, titanium oxide, zirconium oxide, aluminum oxide and magnesium oxide. These oxides may also be mixed or doped. Furthermore, the metals may be vaporized and during the coating process at least one reactive gas, for example oxygen, nitrogen, hydrogen and/or acetylene, may be supplied. The corresponding oxides, nitrides, carbides or mixed components may be produced in the process. Of course reactive gases may also be supplied if the material to be vaporized is already present as an oxide, nitride and/or carbide.

Before metering in at least one reactive gas, the activity of which is increased by the plasma, the vacuum chamber is evacuated to less than $10^{-4}$ mbar and then the corresponding amount of gas is metered in.

The inorganic material situated in the crucible is preferably vaporized by impacting with an electron beam from a scanning high voltage electron beam gun. Here "scanning" is understood to mean, in accordance with expert usage, that the electron beam leaves the surface of the inorganic material to be vaporized under computer control. The voltage applied to the high voltage electron beam gun is preferably at least 5 kV, in particular at least 10 kV, at a current strength of less than 2 A. The high voltage electron beam gun operates, for example at an energy of 35 keV, which is a very high value compared to the low voltage electron beam gun producing the plasma and having electron energy of, for example 50–100 eV.

The ionized, positive particles of material are accelerated against the substrate by means of a "self-bias" voltage produced on the substrate which is negative compared to the plasma, and this contributes to improved layer growth. A negative potential may also be applied to an electrically conducting substrate.

If the wall of the vacuum chamber is insulated with respect to the anode, it is possible to raise the potential of the anode using an additional voltage source, preferably from 20–100 V, which leads to a higher potential difference between plasma and substrate, which in turn leads to a higher acceleration of the ionized particles of material.

An additional, also adjustable, magnetic field may be produced by means of permanent magnets with yoke or direct current coils of appropriate dimensions. According to a first variant, the magnetic field runs parallel to the plasma jet in the direction of travel of the film. The field strength of the additional magnetic field, which produces an improved, more intensive plasma, is a minimum 10 Gauss. The electrons sprayed back from the crucible are deflected by the magnetic field and prevented from reaching the substrate film. The additional magnetic field is screened so that the electron beam of the high voltage electron beam gun is not influenced. According to a second variant, the latter may be arranged, such that the electron beam forms an angle with the crucible axis which differs by 90° everywhere, that is as if it runs parallel to the magnetic field. By appropriate selection of the polarity of the electron beam, it is possible for the electrons to be deflected in the direction of the crucible, as is known per se from German Patentschrift 4 113 364.

The anode may be formed by the crucible or by a further suitable surface, for example a tube, sheet, profile, mesh or wire.

Using the process of the invention rates of precipitation on the substrate are achieved which are at least 0.01 μm/second, but preferably in the range from 0.5–1 μm/second. These rates of deposition are very high compared to those for optical vapor deposition.

Substrate surfaces, in particular plastic films, coated using the process of the invention are preferably moved. The rate of plastic films passing through is advantageously in the range from 1 to 10 m/second, in particular 3–6 m/second. The plastic films consist, for example of polyester (PET), polyethylene (PE), polypropylene (PP) or polyamide (PA).

The object is achieved according to the invention with regard to the coating implement for carrying out the process, in that at least one low voltage electron beam gun, which transmits/transmit an electron beam, with assigned anode, is incorporated in the vacuum chamber between the crucible and the substrate.

Low voltage electron beam guns known per se are preferably designed as hollow cathode electron sources. Seven hollow cathode electron sources may be arranged next to one another for a film width of, for example 2.5 m, their effective regions advantageously overlapping. The anodes of the hollow cathode electron sources may be designed to be separate or together. The plasma produced extends over the entire film width at homogeneous potential.

The crucible with the inorganic material to be vaporized is preferably designed appropriately extending linearly for wide substrate surfaces. A crucible wall may be extended accordingly and form the anode of the low voltage electron beam gun(s). In this case, the crucible is advantageously insulated from the wall of the vacuum chamber.

One application according to the invention of the process serves for coating plastic films for the packaging industry. The advantages have a particularly favorable effect here:

more compact layers which adhere very well to the substrate, hence improved barrier action against gases and liquids, in particular oxygen, water and aromas, low water absorption by the layers, long-term stability of the layers.

The process of the invention with ion assistance during vapor deposition produces a significant improvement in the permeation value of the silicon oxide layers. The addition of nitrogen to the low voltage electron beam gun leads to results which are different to the addition of the noble gas argon. The addition of nitrogen or argon proves to be better depending on the vapor deposition of silicon monoxide or silicon dioxide. The reason may be due to nitrogen also acting as a reactive gas for an SiO system. The layer material acting as a barrier is thus doped with nitrogen atoms.

According to the embodiment of FIG. 1, a plastic film 10 is unwound from a roll 12 in the direction of arrow 14 and drawn over a roller 16. The plastic film 10 lying on the roller 16 as substrate support forms the substrate surface 18 in the working region. After coating, the plastic film 10 is wound onto a further roll 20. Where applicable guide rollers are not drawn for the sake of simplicity.

The inorganic material 24 to be vaporized, which is heated by a scanning high voltage electron beam gun 26 and is ionized slightly, is situated in a crucible 22. A gas phase 28 of inorganic material 24 is formed due to the energy of the electron beam 27.

A low voltage electron beam gun 30 designed as a hollow cathode electron source produces an electron beam 32 which penetrates the gas phase 28 of inorganic material 24. The electrons meet the anode 34 of the low voltage electron beam gun 30. This ionizing electron beam 32 runs approximately horizontally.

A "self-bias" voltage, which leads to a negative potential and is indicated by a minus sign 36, is formed on the substrate surface 18.

Figure 2:
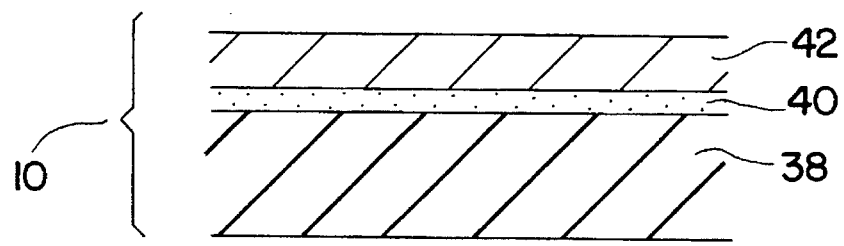
FIG. 2 shows a partial section through a composite film produced.

The composite film 10 shown in FIG. 2 comprises an organic base film 38, a 0.01–2 μm thick inorganic layer 40 vapor-deposited by ion assistance and a sealable organic film 42 which has been applied after the vapor blast process.

Figure 3:
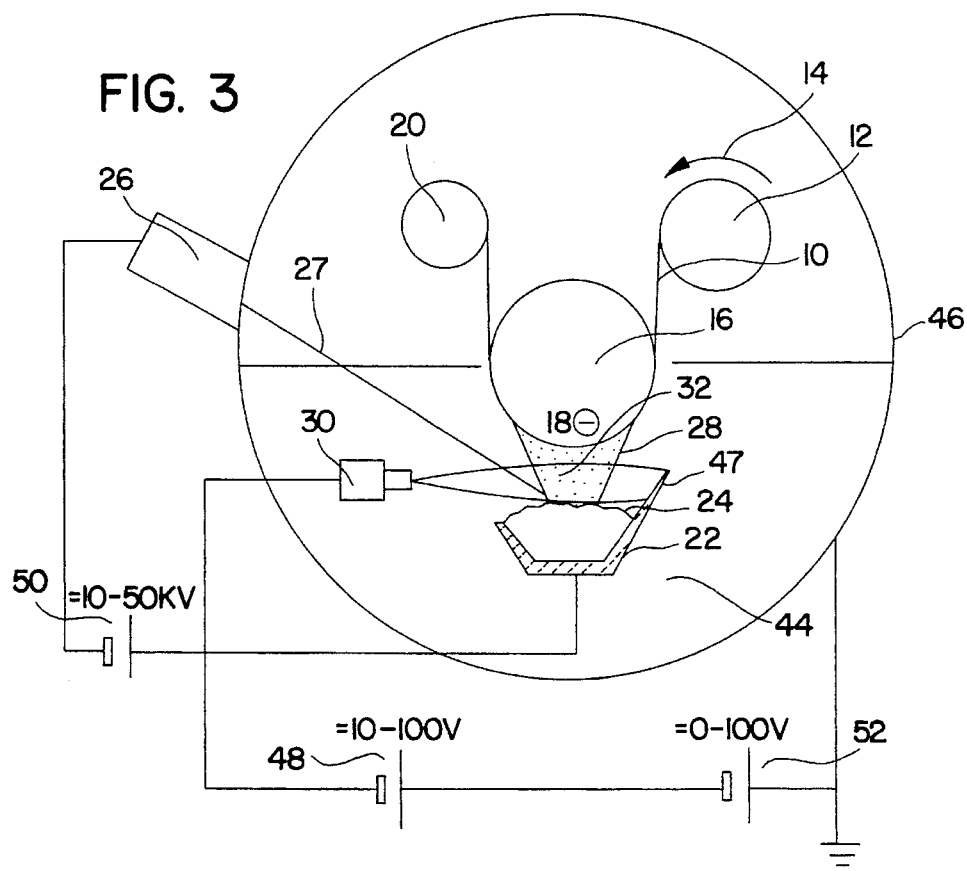
FIG. 3 shows the electrical infrastructure of a coating implement according to FIG. 1.

FIG. 3 shows a vacuum chamber 44 having a wall 46 comprising a high voltage electron beam gun 26, a low voltage electron beam gun 30 with electron beam 32 indicated and the crucible 22 with the inorganic material 24 which can be vaporized. The crucible wall 47 facing away from the low voltage electron beam gun 30 is designed to be extended and serves as anode for the electron beam 32.

A first current source 48, which is electrically connected to the crucible 22 and supplies the low voltage electron beam gun 30, may produce a current up to 300 A at a voltage up to 100 V.

A second current source 50 for supplying the high voltage electron beam gun 26 and likewise electrically connected to the crucible 22, produces a current of 2 A at the most at a voltage of 50 kV.

A third current source 52 can be adjusted to vary in a range 0–100 V. This current source 52 like the others is electrically connected to the crucible 22. The other, earthed lead is electrically connected to the wall 46 of the vacuum chamber 44, and consequently can assume a potential different to the crucible 22.

Figure 4:
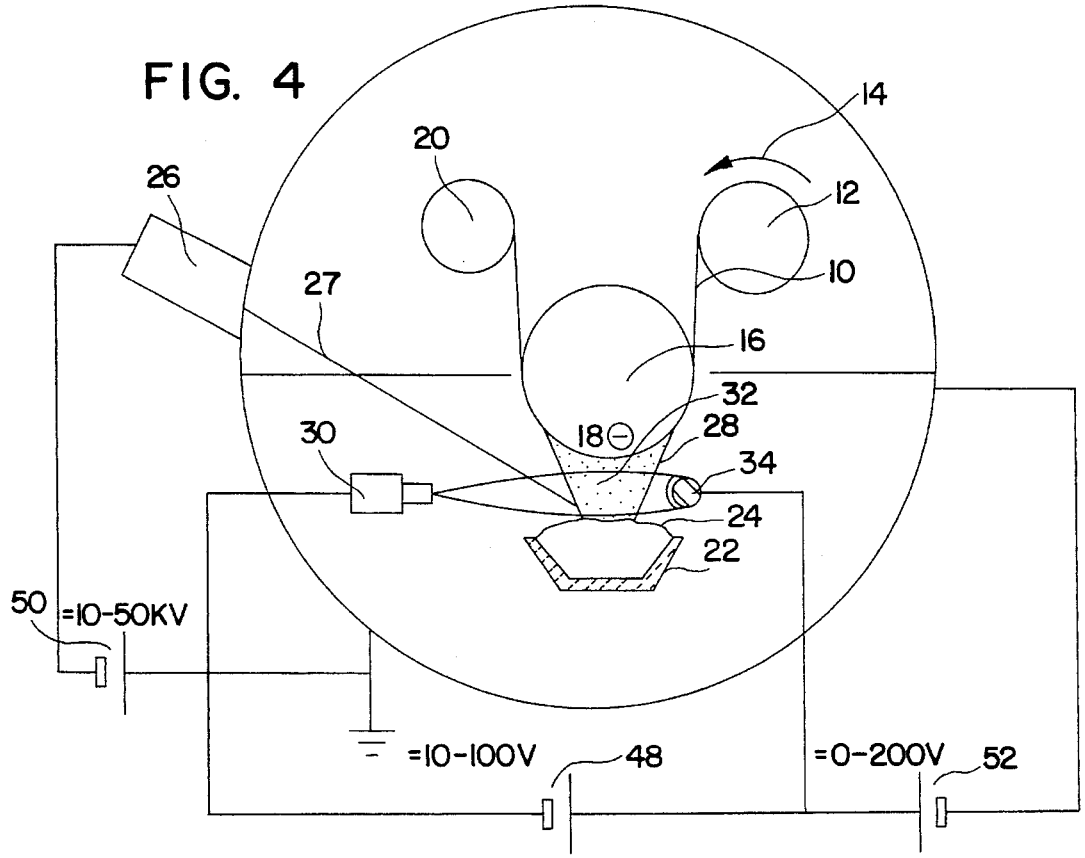
FIG. 4 shows a variant of FIG. 3.

The description of FIG. 3 essentially also applies to FIG. 4. The anode 34 of the low voltage electron beam gun 30 is not the extended crucible wall 47, but a special embodiment shown in detail in FIGS. 5–7. The first current source 48 is connected to the anode 34, the second current source 50 is connected to wall 46 via an earthed lead. An additional voltage of 0–200 V is applied using a further current source 52.

Figure 5:
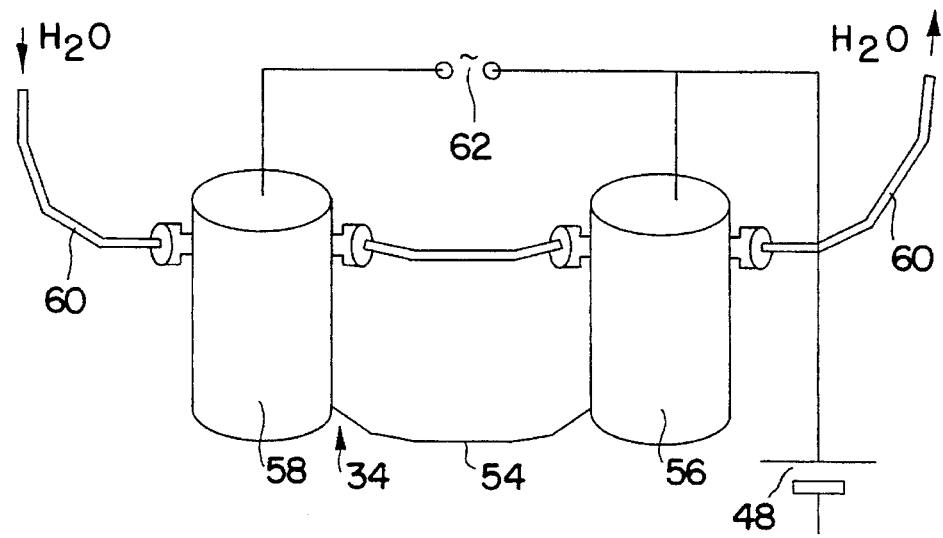
FIG. 5 shows an anode of the low voltage electron beam gun made from a wire with cooled mounting.

An anode 34 of a low voltage electron beam gun shown in FIG. 5 comprises a hot tungsten filament 54, which is attached at mountings 56, 58. These tubular mountings 56, 58 have an insulated surface and are cooled by water supplied via insulated pipes 60. If required, an additional heating voltage is applied via an alternating current source 62. The cathodic conductor of the direct current source 48 leads to the low voltage electron beam gun.

Figure 6:
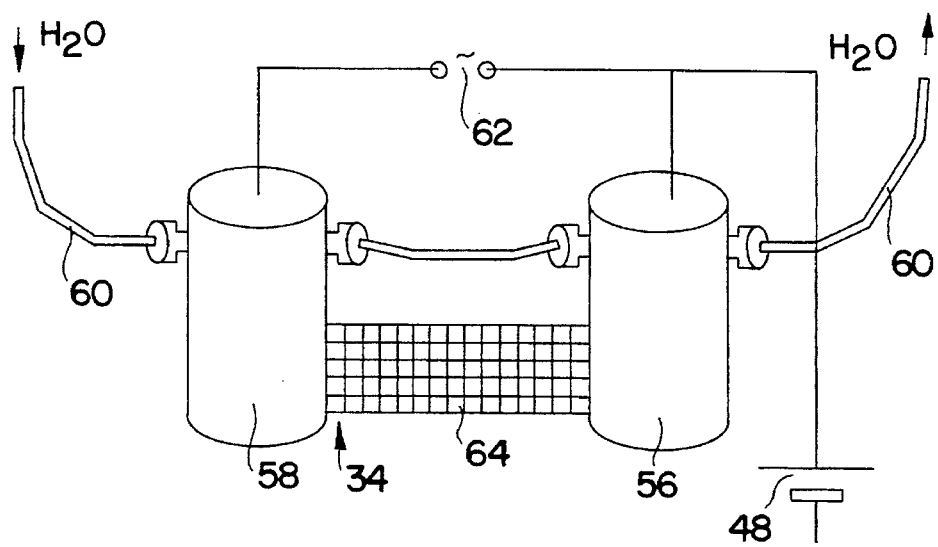
FIG. 6 shows an anode according to FIG. 5 made from a mesh.

FIG. 6 differs from FIG. 5 in that the hot anode surface is formed from a mesh 64.

Figure 7:
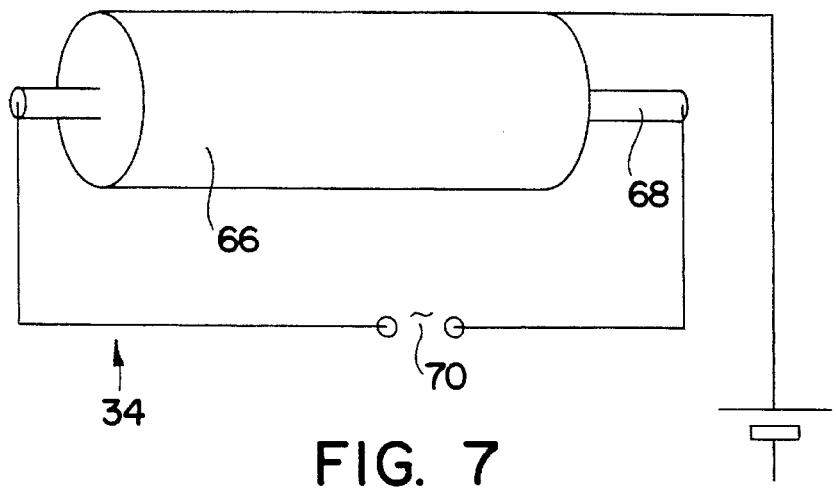
FIG. 7 shows a tubular anode corresponding to FIG. 5.

In FIG. 7 the hot anode surface is a tantalum tube 66 with an axial heating wire 68, to which an alternating current source 70 is applied. The water-cooled mountings are not shown for the sake of simplicity.

EXAMPLE 1

A 12 μm thick, 300 mm wide PET substrate film is coated with $SiO_2$. The $SiO_2$ is heated and vaporized by means of a scanning high voltage electron beam gun by deflecting the beam so that the material is heated linearly transversely to the direction of travel of the conveyer. A low voltage electron beam gun, a hollow cathode, is provided in addition to this high voltage electron beam gun. The plasma of the arc discharge passes through the $SiO_2$ vapor and partially ionizes the vapor. Ten fixed tungsten wires, which are heated by the plasma to over 2,000° C. and thus remain conductable on their surface, serve as the anode for discharge. The hollow cathode is operated using argon. In the region of the crucible itself, nitrogen is also allowed in and is also partly ionized and cleaved to form very reactive atomic nitrogen. This results in a silicon oxinitrite layer on the PET substrate film which has very low natural voltages and is an excellent diffusion barrier for gases, aromatic materials, water vapor and ions. By vapor-depositing such a layer onto a polymer film, such as the polyester film mentioned above, a particularly excellent barrier film is produced which can be further processed to form excellent packaging materials by lamination, printing or extruding. The plasma current of the hollow cathode is about 200 A, the voltage 50 V, the drawing voltage applied additionally to the heated anode is 150 V. Electrons sprayed back from the HV electron beam gun are diverted via this drawing voltage applied to the uncoated anode and thus no longer lead to electrostatic charging of the PET film. The conveyer speed during coating is 200 m/minute, the layer thickness about 50 nm.

In addition, a magnetic field may also be introduced by means of appropriate horse shoe-shaped pole pieces and coils operated using direct current, such that the main field components thereof run parallel to the plasma jet. This magnetic field having a strength of at least 40 Gauss acts as an electron trap both for the plasma electrons and for the rapid electrons sprayed back from the crucible. The plasma density in the region of the vapor may be increased considerably once again due to the magnetic trap effect, and this leads to a lower hollow cathode power to be introduced.

EXAMPLE 2

A 20 μm thick and 1.50 m wide substrate film of oriented polypropylene (oPP) is coated with silicon monoxide. A graphite crucible 2 m in length is heated using radiant heaters. Five hollow cathodes are arranged between the crucible and the substrate film so that each gun acts on approximately 30 mm of material. The hollow cathode electrode consists of $LAB_6$, which is why the hollow cathode is operated directly using a nitrogen/oxygen mixture in an atomic ratio 1:1. The thus very strongly ionized and chemically activated gas mixture reacts very well with the silicon monoxide vapor, as a result of which a similar silicon oxinitrite layer is formed again, as in Example 1. A tungsten anode is also used in this case, it is designed as a mesh.

EXAMPLE 3

An aluminum foil is coated with aluminum oxide. A vaporizer boat bench, as for standard aluminum metallizing plants, serves as a vaporizer. The vaporizer boats consist of doped boron nitrite. Several hollow cathodes are arranged over the coating width, equidistant every 40 cm. The hollow cathodes are operated using argon gas. In the region of the substrate, further additional oxygen is allowed in at a rate such that all the aluminum vapor is oxidized to aluminum oxide on the aluminum foil during condensation. A very much more corrosion-resistant aluminum foil is obtained as a result of the 40 nm thick layer thus deposited. This case also requires a hot anode for arc discharge, it consists of doped boron nitrite.

I claim:

1. Coating implement for coating a substrate surface with an inorganic material to form a permeation barrier against gases and liquids by vaporizing said inorganic material, said coating implement comprising: a vacuum chamber; a crucible containing a source of said inorganic material and said substrate surface positioned within said vacuum chamber; said vacuum chamber being evacuated to at least $10^{-3}$ mbar to provide a gas phase of said inorganic material and to precipitate the vaporized inorganic material on the substrate surface; at least one low voltage electron beam gun for creating at least one ionizing electron beam of low energy which passes through the gas phase of said inorganic material in a direction running approximately parallel to the substrate surface onto a surface of an assigned anode; said assigned anode surface being positioned above said crucible and cooperating with said at least one low voltage electron beam gun, and said at least one low voltage electron beam gun being incorporated in the vacuum chamber between the crucible and a support for the substrate.

2. Coating implement according to claim 1 further comprising: each said low voltage electron beam gun being designed as a hollow cathode electron source for more than one electron beam with overlapping effective regions.

3. Coating implement according to claim 1 further comprising: said anode being designed as a tungsten filament, tungsten mesh or tantalum tube, in each case with a water-cooled mounting.

* * * * *